United States Patent
Lau

(10) Patent No.: US 6,927,563 B2
(45) Date of Patent: Aug. 9, 2005

(54) METHOD AND DEVICE FOR CURRENT VALUE DETERMINATION USING A CURRENT TRANSFORMER WHICH OPERATES IN THE CORE SATURATION REGION

(75) Inventor: Waldemar Lau, Hockenheim (DE)

(73) Assignee: ABB Patent GmbH, Ladenburg (DE)

( * ) Notice: Subject to any disclaimer, the term of this patent is extended or adjusted under 35 U.S.C. 154(b) by 349 days.

(21) Appl. No.: 10/263,096

(22) Filed: Oct. 2, 2002

(65) Prior Publication Data

US 2003/0062887 A1 Apr. 3, 2003

(30) Foreign Application Priority Data

Oct. 2, 2001 (DE) .......................... 101 48 815

(51) Int. Cl.⁷ .......................... G01R 33/00; H01F 38/28
(52) U.S. Cl. .................................. 324/127; 324/103 R
(58) Field of Search ................................ 324/111, 127, 324/522, 658, 678, 117 R, 119, 103 R

(56) References Cited

U.S. PATENT DOCUMENTS

| | | | |
|---|---|---|---|
| 3,334,272 A | 8/1967 | Lipnitz | 361/97 |
| 3,846,675 A | 11/1974 | Shimp | 324/127 |
| 4,255,705 A * | 3/1981 | Milkovic | 324/127 |
| 4,482,862 A * | 11/1984 | Leehey | 324/117 R |
| 4,823,075 A * | 4/1989 | Alley | 324/117 H |
| 4,912,396 A * | 3/1990 | Groenenboom | 324/117 R |
| 5,055,773 A * | 10/1991 | Thomas et al. | 324/132 |
| 6,040,689 A | 3/2000 | Gluszek | 361/95 |

FOREIGN PATENT DOCUMENTS

| | | |
|---|---|---|
| DE | 1 945 347 | 3/1971 |
| DE | 24 04 048 C2 | 11/1974 |
| DE | 118 728 | 3/1976 |
| DE | 27 04 337 C2 | 8/1977 |
| DE | 37 10 880 A1 | 10/1987 |
| DE | 39 12 542 A1 | 10/1990 |
| DE | 43 26 538 C2 | 2/1995 |
| DE | 198 02 831 A1 | 8/1998 |
| DE | 199 58 938 A1 | 6/2001 |
| EP | 0 445 921 B1 | 9/2001 |
| FR | 2551217 A1 * | 3/1985 ........... G01R/19/15 |
| GB | 2 339 295 A | 1/2000 |

OTHER PUBLICATIONS

Tietze/Schenk: "Halbleiterschaltungstechnik" [semiconductor circuit technology], *Springer Verlag, Berlin, 1993, pp. 876–880, XP–002274203.*

* cited by examiner

*Primary Examiner*—Anjan Deb
(74) *Attorney, Agent, or Firm*—Laureance A. Greenberg; Werner H. Stemer; Ralph E. Locher

(57) ABSTRACT

The invention relates to a method for determining a value of a current using a current transformer that operates in the core saturation region. A peak value detector determines a peak value of one half-cycle of the secondary current. The peak value is stored in a storage element for further processing. A comparator detects that the peak value has been reached. After this, the comparator supplies a switching signal to a signal processing unit, and this signal starts the signal processing unit. The signal processing unit receives the peak value that was stored in the storage element and provides this value for further processing. A RESET pulse is then transmitted to a switching apparatus to discharge the storage element and thus allow the detection of the next peak value.

16 Claims, 2 Drawing Sheets

METHOD AND DEVICE FOR CURRENT VALUE DETERMINATION USING A CURRENT TRANSFORMER WHICH OPERATES IN THE CORE SATURATION REGION

BACKGROUND OF THE INVENTION

Field of the Invention

The invention relates to a method and a device for determining a value of a current using a current transformer operating in the core saturation region.

Overcurrents frequently occur in electrical circuits, for example, when starting motors. These overcurrents are either used to indicate a condition or are used to switch off electronic motor protection and control devices. These electronic motor protection and control devices have variable motor classes by means of which, the rated current values and protection classes are set. A current transformer accurately detects a rated current or an overcurrent and, for example, provides this information to microprocessor-controlled electronic assemblies that process these current values further.

Motor protection and control devices are known, for example, the SIMOCODE-DP 3UF5 from the Siemens Company uses current transformers to record the rated current while at the same time detecting the overcurrent. Based on their current setting ranges, which are listed in the "Siemens NS K 1999/2000 low-voltage switching technology" catalog, these devices have a current detection range from about 1 to 40, although only narrow ranges for motor rated currents are still available for a motor overcurrent of 10 times the rated current ($I_{rated}$).

For this reason, a number of different types of devices are offered, in order to cover a typical motor current spectrum required by users, in the range from about 0.2 A to 63 A.

The disadvantage of compensating current transformers results from the high level of electrical and electronic circuit complexity and from using additional transformer windings. The compensation also results in additional heat losses at high motor currents. Producing these devices demands a high level of mechanical precision, which results in a high device price. For these reasons, these devices are largely used only for retrofitting based on an acceptable installation requirement or for high-power motors.

SUMMARY OF THE INVENTION

It is accordingly an object of the invention to provide a method and a device for determining a value of a current by using a current transformer in which a considerably wider current detection range is covered without having to change the transformer size.

With the foregoing and other objects in view there is provided, in accordance with the invention, a method for determining a value of a current. The method includes steps of: providing a current transformer operating in a core saturation region; with a peak value detector, determining a peak value of a half-cycle of a secondary current flowing in the transformer; storing the peak value in a storage element for further processing; with a comparator, detecting when the peak value of the half-cycle of the secondary current has been reached and on reaching the peak value, supplying a switching signal to a signal processing unit to start the signal processing unit; with the signal processing unit, obtaining the peak value stored in the storage element and providing the peak value for further processing; and subsequently, transmitting a RESET pulse to a switching apparatus to discharge the storage element and to allow detection of a subsequent peak value.

In accordance with an added mode of the invention, the method includes: providing the signal processing unit as a sample and hold module; and with the comparator, triggering a pulse generator to transmit a pulse to the sample and hold module to transfer the peak value from the storage element to the sample and hold module.

In accordance with an additional mode of the invention, the method includes: with the pulse generator, supplying a negative edge of a pulse to a downstream pulse generator; and with the downstream pulse generator, causing the switching apparatus to close briefly to discharge the storage capacitor and to allow the detection of the subsequent peak value.

In accordance with another mode of the invention, the method includes: obtaining the peak value from the signal processing unit and using the peak value to calculate a motor protection function.

In accordance with a further mode of the invention, the method includes: obtaining the peak value from the signal processing unit and using the peak value to determine a root mean square value.

In accordance with a further added mode of the invention, the method includes: using a resistor to limit a current flowing through the switching apparatus.

With the foregoing and other objects in view there is provided, in accordance with the invention, a device for determining a value of a current. The device includes: a current transformer for operating in a core saturation region, the transformer having a secondary winding; a measurement resistor connected in parallel with the secondary winding of the transformer; a peak value detector for determining a peak value of a half-cycle of a secondary current flowing in the secondary of the transformer; a storage element for storing the peak value determined by the peak value detector; a signal processing unit; a comparator for determining whether the secondary current has reached the peak value obtained from the peak value detector, and if so, for supplying a switching signal to the signal processing unit for activating the signal processing unit; and a switching apparatus for discharging the storage element and allowing a subsequent peak value to be detected.

In accordance with an added feature of the invention, the signal processing unit is configured for producing a RESET signal for briefly closing the switching apparatus and thereby discharging the storage element.

In accordance with an additional feature of the invention, a resistor is connected to the switching apparatus for limiting a current flowing through the switching apparatus.

In accordance with another feature of the invention, the storage element is a storage capacitor.

In accordance with a further feature of the invention, there is provided: a first pulse generator for generating a pulse; and a sample and hold module for transferring the peak value stored in the storage element when activated by the pulse generated by the pulse generator. The first pulse generator is connected downstream from the first pulse generator.

In accordance with a further added feature of the invention, there is provided: a second pulse generator configured for briefly closing the switching apparatus so that the storage capacitor will be discharged and the subsequent peak value can be detected. The second pulse generator is activated by the first pulse generator.

In accordance with a further additional feature of the invention, the signal processing unit is a microcontroller with an integrated analog/digital converter for providing a signal; and the microcontroller further processes the signal from the analog/digital converter.

In accordance with yet an added feature of the invention, there is provided, a root mean square value indicating device.

The signal processing unit provides an output signal to the root mean square value indicating device.

In accordance with yet an additional feature of the invention, the signal processing unit is configured for providing a signal for calculating a motor protection function.

In accordance with yet another feature of the invention, the peak value detector is a precision detector.

Since the current of a motor is integrated by the periodic movement of the rotor and by the high inductive component in the starting phase due to the stray inductance as a result of the air gap, the motor current is a periodic function. This is still true when the motor is actuated by voltage pulses, as in the case of frequency converters, for example. The motor current waveform is sinusoidal, both for single-phase motors and for three-phase motors.

By virtue of their design, current transformers are considered to be transformers in which the windings include a small number of primary turns and a large number of secondary turns. A primary current $I_{prim}$ is converted to a secondary current $I_{sec}$ based on the ratio of the numbers of turns between the primary and secondary windings. This secondary current $I_{sec}$ is then detected as a voltage drop by an instrument or by a digital signal processing circuit. The magnetic flux $\Phi$ in the magnetic core is also proportional to the primary current $I_{prim}$.

The voltage response can be described as follows: Based on Lenz's law, in accordance with which the induction current is always produced in such a direction that it counteracts the cause, magnetic fields that are produced by the two windings in the magnetic core are always in mutually opposite directions. The magnetic flux $\Phi$ which is produced in the transformer core in consequence induces a secondary voltage $U_{sec}$.

The voltage $U_{sec}$ that is induced in the secondary winding by the primary current $I_{prim}$ is given by the following relationship:

$U_{sec} = -d\Phi/dt$ where $\Phi \sim I_{prim}$ and $d\Phi/dt$ is the flux change.

The voltage $U_{sec}$ follows the primary current $I_{prim}$ in the form of a cosine function, that is to say with a phase shift of 90°. In consequence, the secondary voltage $U_{sec}$ reaches its maximum value when the primary current $I_{prim}$ and hence the flux $\Phi_{prim}$ that is produced passes through a zero crossing, since this is where the rate of change of the flux $d\Phi/dt$ is at a maximum. The magnetic core is not saturated in this region. The induced voltage peak value is in consequence mathematically correctly an image of the peak value of the induced primary current $I_{prim}$; to be precise with a lagging phase shift of 90°.

A large rise in the primary current $I_{prim}$ causes the magnetic core to enter saturation, with the secondary circuit being cyclically operated on no load for a time interval.

The secondary voltage $U_{sec}$ on both sides of the peak value is a sinusoidal periodic function over a specific angle. This angle is governed by the saturation points of the magnetic core based on the hysteresis curve or the magnetization characteristic. As the primary current $I_{prim}$ rises, this angle decreases, and the induced voltage becomes ever more pulse-shaped. The pulse area is governed by the voltage time integral of the magnetic core that is used.

The voltage which is induced in the secondary winding produces a current with a lag of 90° in the inductance, and this produces a corresponding signal for electronically further processing. This signal can be obtained across a measurement resistor which is connected in parallel with the secondary winding.

The extension of the current detection region by operating the current transformer in the core saturation region results in the advantages described below.

With the same requirements for the current detection range, it is possible to develop smaller, lighter and lower-cost current transformers, or else a considerably wider current detection range can be covered with the same transformer size.

The method allows a reduced power loss to be achieved, and hence a lower temperature in the transformer windings and in the measurement resistor, as a result of the waveform of the secondary current resulting from core saturation.

Other features which are considered as characteristic for the invention are set forth in the appended claims.

Although the invention is illustrated and described herein as embodied in a method and device for current value determination using a current transformer which operates in the core saturation region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
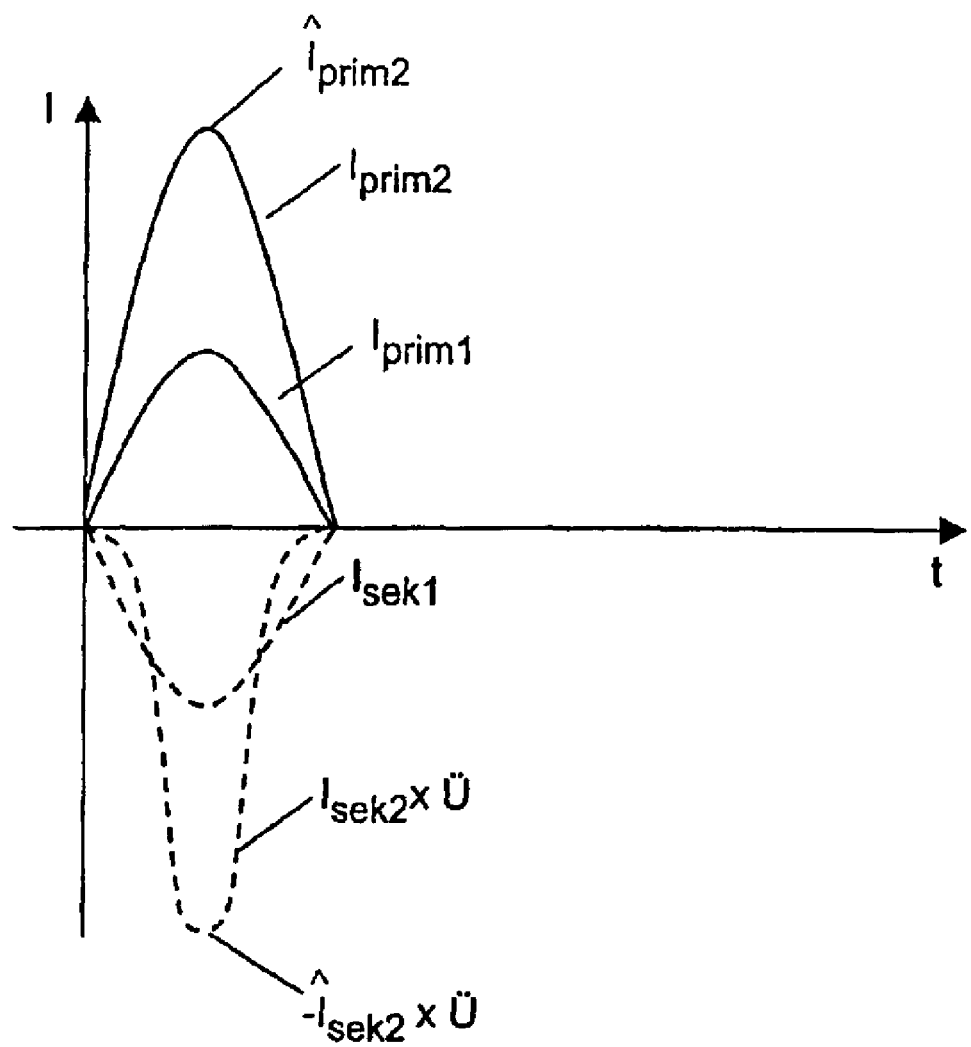
FIG. 1 is an illustration of current waveforms as a function of the magnetic core saturation.

Referring now to the figures of the drawing in detail and first, particularly, to FIG. 1 thereof, one can see waveforms of the primary current $I_{prim}$ and of the secondary current $I_{sec}$ when the current transformer is operated in the region of an unsaturated and a saturated magnetic core. The peak values of the primary current $I_{prim}$ and of the secondary current $I_{sec}$ in the current transformer are given by the following relationship:

$$\hat{I}_{prim} = -\hat{I}_{sec} * \ddot{U},$$

where:
$\ddot{U}$=the transformer ratio between the primary and secondary windings, $\hat{I}_{sec}$=peak value of the secondary current, and $$\hat{I}_{prim2} = -\hat{I}_{sec2} * \ddot{U}.$$

Assuming that the phase current in a three-phase electric motor describes a periodic function, the peak values of the current and voltage are given by the following relationships:

$$\hat{I} = I_{rms} * \sqrt{2} \rightarrow I_{rms} = \hat{I}/\sqrt{2} * \ddot{U}$$

-continued $$\hat{U} = U_{rms} * \sqrt{2} \rightarrow U_{rms} = \hat{U}/\sqrt{2}$$

This results in the following root mean square value for the measured phase current $I_{rms}$ when the magnetic core is saturated and $$I_{sec2} * \ddot{U}:$$

$$I_{rms} = \hat{I}_{sec2}/\sqrt{2} * \ddot{U}.$$

The root mean square value of the current is now used for further processing and/or for indication.

Figure 2:
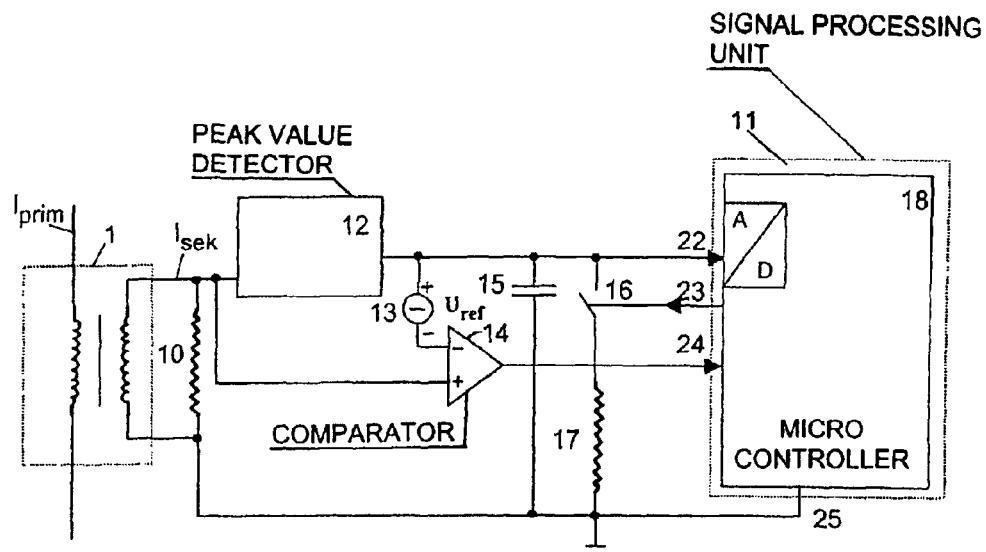
FIG. 2 is a schematic diagram of a current transformer and a microcontroller that is used to process the secondary current in the secondary inductance.

The device for current value determination is illustrated in FIG. 2, and contains a current transformer 1 that converts the primary current $I_{prim}$ to a secondary current $I_{sec}$ using a specific transformation ratio Ü between the primary winding and the secondary winding. A rectifier circuit is connected in the secondary path, and a measurement resistor 10 is connected in parallel to the secondary winding. In this case, a peak value of, for example, one positive half-cycle is determined by using a peak value detector 12, which is preferably a precision detector, and this peak value is stored in a storage element 15 for further processing. The storage element 15 is preferably a storage capacitor.

If the peak value in the half-cycle is exceeded, this is detected by a comparator 14, which draws its reference voltage $U_{ref}$ from a reference voltage source 13. The comparator 14 passes an interrupt signal to an input 24 of a signal processing unit 11 (which, by way of example, contains a microcontroller 18), in order to activate the microcontroller 18.

In addition to the input 24 for the interrupt signal, the microcontroller 18 has a further input 25 for a ground potential.

The analog/digital converter, which is integrated into the microcontroller 18, has an input 22 receiving the peak value of the half-cycle that was stored in the storage capacitor 15, and the microcontroller 18 processes this value further. The digitized value is then used further, for example for calculating a motor protection function.

After receiving the peak value and subjecting it to digital/analog conversion, the output 23 of the microcontroller 18 emits a RESET pulse to a switching apparatus 16. The switching apparatus 16 is connected in series with a resistor 17 for current limiting.

The switching apparatus 16, which is connected in parallel with the storage capacitor 15, now closes briefly, causing the storage capacitor 15 to be discharged. The device is then ready to detect a next peak value.

Figure 3:
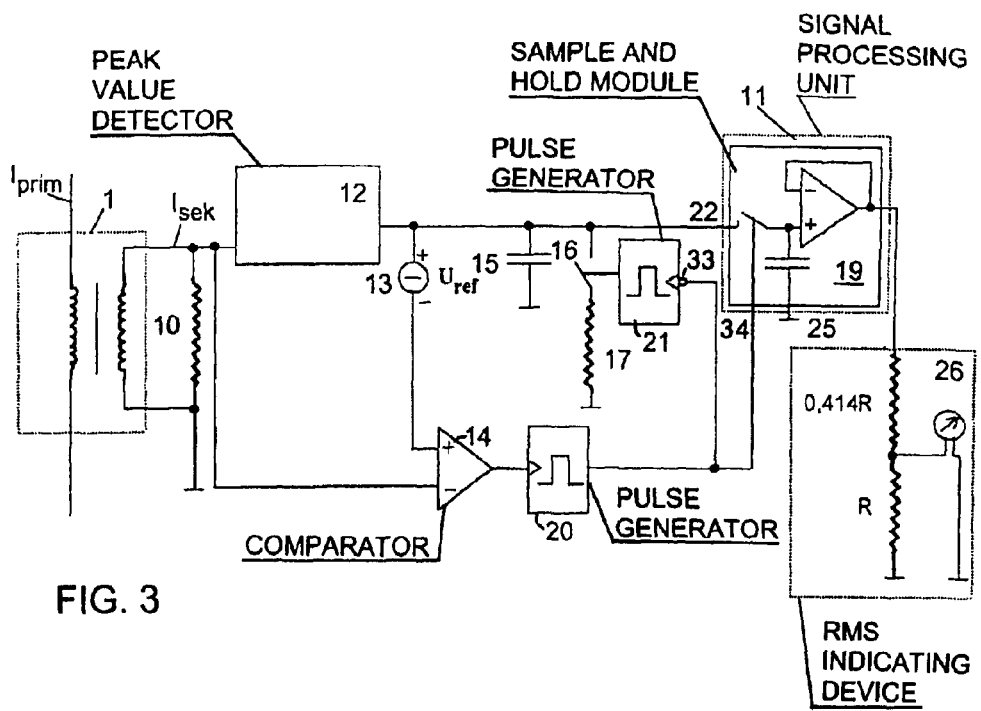
FIG. 3 is a schematic diagram of a current transformer having a secondary winding supplying output current to a sample and hold module.

In FIG. 3, the peak value detection for a positive half-cycle is carried out by using peak value detection, in the same way as in FIG. 2.

In this case, the comparator 14 is followed by a first pulse generator 20, which is triggered by the positive edge of the comparator 14.

With the positive edge of the pulse output from the first pulse generator 20, the input 24 of the signal processing unit 11 (which is in the form of a sample and hold module 19) receives a command to transfer the peak value that is stored in the storage capacitor 15 to the input 22 of the sample and hold module 19.

The negative edge of the pulse output by the first pulse generator 20 is supplied with a time delay to the input 33 of a downstream second pulse generator 21, so that the second pulse generator 21 causes the switching apparatus 16, which is connected in parallel with the storage capacitor 15, to be closed briefly. In consequence, the storage capacitor 15 is discharged, and the device is ready to detect the next peak value. The switching apparatus 16 is in this case likewise connected in series with a resistor 17 for current limiting.

The output value from the sample and hold module 19 is used, for example, after being divided by √2 using a voltage divider, to indicate the root mean square value in a root mean square value indicating device 26.

I claim:

1. A method for determining a value of a current, which comprises:
   providing a current transformer operating in a core saturation region;
   with a peak value detector, determining a peak value of a half-cycle of a secondary current flowing in the transformer;
   storing the peak value in a storage element for further processing;
   with a comparator, detecting when the peak value of the half-cycle of the secondary current has been reached and on reaching the peak value, supplying a switching signal to a signal processing unit to start the signal processing unit;
   with the signal processing unit, obtaining the peak value stored in the storage element and providing the peak value for further processing; and
   subsequently, transmitting a RESET pulse to a switching apparatus to discharge the storage element and to allow detection of a subsequent peak value.

2. The method according to claim 1, which comprises:
   providing the signal processing unit as a sample and hold module; and
   with the comparator, triggering a pulse generator to transmit a pulse to the sample and hold module to transfer the peak value from the storage element to the sample and hold module.

3. The method according to claim 2, which comprises:
   with the pulse generator, supplying a negative edge of a pulse to a downstream pulse generator; and
   with the downstream pulse generator, causing the switching apparatus to close briefly to discharge the storage capacitor and to allow the detection of the subsequent peak value.

4. The method according to claim 1, which comprises:
   obtaining the peak value from the signal processing unit and using the peak value to calculate a motor protection function.

5. The method according to claim 1, which comprises:
   obtaining the peak value from the signal processing unit and using the peak value to determine a root mean square value.

6. The method according to claim 1, which comprises:
   using a resistor to limit a current flowing through the switching apparatus.

7. A device for determining a value of a current, comprising:
   a current transformer for operating in a core saturation region, said transformer having a secondary winding;
   a measurement resistor connected in parallel with said secondary winding of said transformer;
   a peak value detector for determining a peak value of a half-cycle of a secondary current flowing in said secondary of said transformer;
   a storage element for storing the peak value determined by said peak value detector;

a signal processing unit;

a comparator for determining whether the secondary current has reached the peak value obtained from said peak value detector, and if so, for supplying a switching signal to said signal processing unit for activating said signal processing unit; and a switching apparatus for discharging said storage element and allowing a subsequent peak value to be detected.

8. The device according to claim 7, wherein:

said signal processing unit is configured for producing a RESET signal for briefly closing said switching apparatus and thereby discharging said storage element.

9. The device according to claim 7, comprising: a resistor connected to said switching apparatus for limiting a current flowing through said switching apparatus.

10. The device according to claim 7, wherein: said storage element is a storage capacitor.

11. The device according to claim 7, comprising:

a first pulse generator for generating a pulse; and a sample and hold module for transferring the peak value stored in said storage element when activated by the pulse generated by said pulse generator;

said first pulse generator being connected downstream from said first pulse generator.

12. The device according to claim 11, comprising:

a second pulse generator configured for briefly closing said switching apparatus so that said storage capacitor will be discharged and the subsequent peak value can be detected;

said second pulse generator being activated by said first pulse generator.

13. The device according to claim 7, wherein:

said signal processing unit is a microcontroller with an integrated analog/digital converter for providing a signal; and said microcontroller further processes the signal from said analog/digital converter.

14. The device according to claim 7, comprising:

a root mean square value indicating device;

said signal processing unit providing an output signal to said root mean square value indicating device.

15. The device according to claim 7, wherein: said signal processing unit is configured for providing a signal for calculating a motor protection function.

16. The device according to claim 7, wherein: said peak value detector is a precision detector.

* * * * *